350-1.6 SR

XR 3,816,223

United States Patent [19] K 3016 W

Ahn et al.

[11] 3,816,223

[45] June 11, 1974

[54] FABRICATION MASK USING RARE EARTH ORTHOFERRITES

[75] Inventors: Kie Y. Ahn, San Jose, Calif.; Jerome J. Cuomo, Bronx, N.Y.

[73] Assignee: International Business Machines Corporation, Armonk, N.Y.

[22] Filed: Dec. 27, 1971

[21] Appl. No.: 212,251

[52] U.S. Cl. .................. 95/1 R, 96/36.2, 96/38.3, 350/1, 350/314, 355/125

[51] Int. Cl. .................. G02b 5/22

[58] Field of Search ....... 350/1, 314, 311, 316, 317; 117/33.3; 95/1 R; 355/125, 133; 96/36.2, 38.3

[56] References Cited

UNITED STATES PATENTS 3,661,436 5/1972 Horwath et al. .................. 350/1

OTHER PUBLICATIONS

Hackh's Chemical Dictionary 4th Edition, McGraw Hill, page 732.

*Primary Examiner*—Ronald J. Stern
*Attorney, Agent, or Firm*—Jackson E. Stanland

[57] ABSTRACT

A mask for the manufacture of semiconductor and various small components. Rare earth orthofertites, such as $GdFeO_3$, as well as $YFeO_3$, and $LaFeO_3$ comprises the masking material. Rare earth combinations, such as $(Gd, Eu)_1FeO_3$, can also be used for the masking material. This masking material is harder than the components being manufactured and is opaque to the wavelength used in photoresist techniques while being transparent to visible wavelengths over broad thickness ranges. The mask can comprise a patterned layer on a substrate or patterned bulk crystals having regions of different thickness. Substrates such as soda-lime glass, sapphire, quartz, etc. are suitable. The masking material can be deposited as large area films having good uniformity and good optical properties. The material is readily etched but is not attacked by materials used in photoresist processing. Its reflectivity is very low, thereby providing easy alignment and good image defination during use.

10 Claims, 12 Drawing Figures

3816223

FABRICATION MASK USING RARE EARTH ORTHOFERRITES

BACKGROUND OF THE INVENTION

1. Field of the Invention

This invention relates to a fabrication mask for the production of small components. and more particularly to masks which are wear resistant and capable of visual alignment during fabrication of the small components.

2. Description of the Prior Art

In the fabrication of small components, and particularly semiconductor components, masks are extensively used. For instance, such masks enable the definition of precise patterns of very small size on a semiconductor wafer. However, it is at present very difficult to produce micron and submicron components with existing mask techniques.

In many semiconductor processes, a wafer of semiconductor material is coated with a layer of photoresist, after which a mask is brought into contact with the photoresist layer. Light of a particular wavelength (usually ultraviolet) will pass through the mask openings and will expose the photoresist in those portions uncovered by the mask. After development, the wafer is etched in the developed locations. If desired, further process steps, such as diffusion or evaporation of another material, are then done.

In the sample process above, it is very important that the mask be properly aligned with patterns already on the wafer and that it define the very small dimensions required. Further, the mask must be used numerous times and therefore must be wear resistant. During the fabrication processes, the mask must be continually moved. Therefore, real time alignment (i.e., rapid alignment during actual use) is required in order to obtain high device yield.

Existing masks, such as chromium-on-glass, cadmium sulfide, and photographic emulsion masks, do not meet these requirements. For instance, the chromium masks are not transparent to visible light, and alignment problems are difficult. Usually, markers are used to position the masks during the fabrication steps, although this leads to inaccuracies and a resultant low fabrication yield.

Chromium-on-glass masks can be damaged by surface imperfections on the underlying semiconductor. For instance, the spikes which are formed during epitaxial deposition are large and may seriously damage the mask when it is placed in contact with the semiconductor surface. Since the mask is generally much more expensive than the underlying semiconductor wafers, this damage represents a serious and costly problem.

Even if transparent masks are used, some of the presently known masks of this type are comprised of very soft material, such as photographic emulsions and cadmium sulfide. These masks are easily damaged by surface imperfections and have very short lifetimes.

Copending application Ser. No. 51,237, filed June 30, 1970 in the name of R. S. Horwath et al. and assigned to the present assignee, now U.S. Pat. No. 3,661,436 describes a semitransparent mask using multicomponent oxides and fluorides, such as spinels, perovskites, and garnets. Although these materials are suitable as transparent masks, some difficulties arise in etching these materials and in fabricating with large area films of these materials. Also, the defect densities which result are sometimes large.

Accordingly, it is a primary object of this invention to provide a mask which is suitable for the fabrication of very small devices and which can be deposited as a large area film having good optical properties.

It is another object of this invention to provide a fabrication mask which can be visually aligned during fabrication processes and can be made using standard techniques.

It is still another object of this invention to provide fabrication masks which are extremely hard and which have good uniformity of thickness and material properties.

It is a further object of this invention to provide a mask for the fabrication of small components which is readily etched by known etchants.

It is another object of this invention to provide a mask for the fabrication of small components which has very low reflectivity and which is not attacked by the solutions used in the component manufacturing process in which the mask is employed.

BRIEF SUMMARY OF THE INVENTION

This mask can be used in the manufacture of micron and sub-micron components and is particularly suited to the manufacture of semiconductor components. The masking material is a rare earth orthoferrite, or $YFeO_3$, or $LaFeO_3$. Combinations of rare earth elements can also be used in the orthoferrite. For instance, $(A_x, B_y)FeO_3$ where A and B are rare earth elements and $x+y=1$, is suitable.

A wide range of thickness (500–20,000A) of masking material will provide a semitransparent mask which is transparent to visible radiation and opaque to the radiation used in the component manufacturing process. The substrate is generally about 0.06 inch thick and is made of a material which is transparent to both visible radiation and the radiation used in the component manufacturing process.

Three embodiments are provided for a patterned masking material comprising these orthoferrites. In the first embodiment, the masking material is deposited as a thin film on a substrate, and is patterned to provide the mask. In this case, the film of masking material is provided with regions of lesser thickness which will be transparent to both visible radiation and the radiation used to expose photoresist in component manufacturing processes in which the mask is employed. For instance, the regions of lesser thickness will be transparent to ultraviolet radiation which is generally used to expose photoresist layers.

In a second embodiment, the masking material is provided as patterned deposits in one surface of a substrate. The thickness of the deposits is determined in accordance with the radiation to be used in component fabrication processes in which the mask is employed. For instance, the deposits of masking material are generally selected to be opaque to the wavelength of the radiation used to expose photoresist layers. In addition, the thickness of the deposit of masking material is generally chosen so that these deposits will be transparent to visible radiation, which is generally the case for the substrate. In this manner, a semitransparent mask suitable for visual alignment will be provided.

In a third embodiment, the mask is comprised of a bulk crystal of the masking material, which is not supported by a substrate. To provide the patterns having different transmission of radiation, this bulk crystal has regions of varying thickness. The regions of lesser thickness are chosen to be transparent to the radiation used in the component manufacturing processes in which the mask is employed while the thick regions are opaque to this radiation. For instance, these regions of lesser thickness will generally be chosen to be transparent to ultraviolet radiation which is conventionally used to expose photoresist layers. The bulk crystal is generally transparent to visible radiation (or at least is transparent in its regions of lesser thickness) to allow visual alignment of the mask.

The foregoing and other objects, features, and advantages of the invention will be apparent from the following more particular description of the preferred embodiments of the invention as illustrated in the accompanying drawings.

DESCRIPTION OF THE PREFERRED EMBODIMENTS

FIGS. 1A–1D illustrate one method for forming a mask according to this invention. The final mask configuration comprises a thin film of masking material located on a substrate. There are holes in the masking material which create a patterned masking layer. That is, the final structure is similar to that shown in FIG. 3.

Figure 1A:
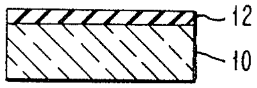
FIGS. 1A–1D illustrate a method for making a mask whose final structure is similar to that of FIG. 3.

In FIG. 1A a substrate 10 is coated on one surface by a thin film of masking material 12. The substrate material is not critical and materials such as soda-lime glasses, sapphire, quartz, etc., are suitable. The substrate thickness is generally about 0.06 inch which is standard practice in the industry. Usually, the substrate will be transparent to both visible radiation and radiation used to expose photoresist layers used in component manufacturing process in which the mask is employed. This means that generally the substrate material will be transparent to near ultraviolet radiation, since this is the radiation most commonly used to expose photoresist layers. The masking material in layer 12 is opaque to ultraviolet radiation and transparent to visible radiation to provide a semitransparent mask. For this purpose, layer 12 can be from approximately 500 angstroms to 20,000 angstroms in thickness. The lower limit of 500 angstroms is generally chosen by the condition that the masking material not have an excessive amount of pinholes.

A masking layer thickness of about 3,000 angstroms will provide an optical density of 2 for input radiation having a wavelength of about 5,000 angstroms. The optical density is a measure of the contrast ratio for light transmitted through the mask area and the clear area. It is desirable that in the optical window defining the wavelength range of sensitivity of the photoresist that the optical density be at least equal to one (preferably greater than two) so that there will be a significant difference between the transmission of ultraviolet radiation through the masked areas and the unmasked areas. Thicknesses above 20,000 angstroms usually are not desirable since the mask will sometimes become opaque to visible light and the visual alignment feature will be lost.

The masking material is a rare earth orthoferrite ($GdFeO_3$, $EuFeO_3$, etc.) or $YFeO_3$, or $LaFeO_3$. Also rare earth combinations can be used. For instance, $(A_x, B_y)FeO_3$, where A and B are rare earth elements and $x+y=1$, is a suitable masking material.

Masking layer 12 can be applied to substrate 10 in a number of ways including sputtering and evaporation. Conventional sputtering using powdered or mixed targets is suitable. For instance, $GdFeO_3$ films can be sputtered from a cathode made by hot pressing a mixture of powders of $Fe_2O_3$ and $Gd_2O_3$. In this case, the substrate temperatures can be between 25°C and 200°C. The sputtering power density can vary between 8.75 watts/cm.$^2$ and 3.15 watts/cm.$^2$. Deposition in Ar, Ar and $O_2$ or pure $O_2$ is suitable. It is also possible to use spray techniques or spinning techniques to provide layer 12. In general, any ceramic deposition technique for growing continuous films can be used.

Since the masking material 12 is etchable, a very thick layer can be grown and then etched to the desired thickness. For instance, $GdFeO_3$ is etchable using dilute HCl. Also the masking layer can be ion milled or sputter etched to provide patterns in it.

Figure 1B:
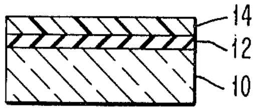

In FIG. 1B, a thin layer of photoresist 14 is deposited on masking layer 12. The thickness of the photoresist layer is not critical. It is only important that the full thickness of layer 14 be exposable with radiation, most generally ultraviolet radiation.

In contrast with other masking materials such as iron oxide, the masking materials of the present invention can be used with a variety of photoresist materials such as those made by the Eastman Kodak Company and by the Shipley Company. Both positive and negative photoresists can be used. Surprisingly, even though these masking materials are easily etched by dilute acids, they are not attacked at all by the solutions used in the photoresist development and stripping processes. Consequently, any type of photoresists can be used with these masking materials.

Figure 1D:
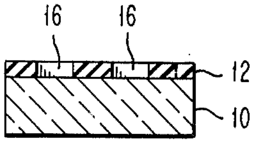
Figure 2D:
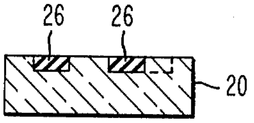

Photoresist layer 14 is selectively exposed with ultraviolet light and then the exposed regions are dissolved using a suitable solvent. Dilute HCl acid is then used to etch masking layer 12 and the resulting mask is that of FIG. 1C. After removal of photoresist 14 and masking layer 12 in selected regions 16, the remaining unexposed photoresist is removed leaving the final mask structure as shown in FIG. 1D. This final structure consists of substrate 10 and a masking layer 12 which has selectively etched hole 16 therein. This structure is shown in a perspective view in FIG. 3. In that figure, it is readily apparent that the mask has a pattern of geometrically arranged openings 16 in the masking layer 12. Although the openings 16 are shown as extending to the top surface of substrate 10, it should be understood that they need not extend to the substrate 10. For instance, a thin layer of masking material less than 500 angstroms can be left in the selected regions 16.

Another suitable method for making a mask is shown in FIGS. 2A–2D. In this method, openings will be provided in a substrate into which is deposited the masking material. This structure (FIG. 4) differs from that of FIG. 3 in which an external layer of masking material 12 has etched opening 16 in it. Of course, the same considerations apply with respect to thickness of masking material buried in the substrate as were applied for the thickness of layer 12 in the mask of FIG. 3.

Figure 2A:
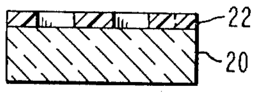
FIGS. 2A–2D illustrate a method for making a mask whose final structure is similar to that of FIG. 4.

In FIG. 2A, the substrate 20 has a pattern of photoresist 22 on its top surface. This photoresist pattern is produced in conventional ways, as by uniformly coating the surface of substrate 20 with a photoresist layer and then developing selected portions. The selected portions are then dissolved away leaving a pattern similar to that shown in FIG. 2A.

Figure 2B:
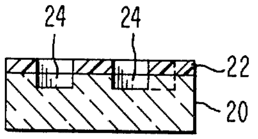
Figure 1C:
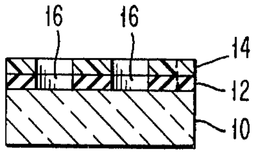
Figure 2C:
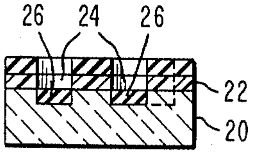

In FIGS. 2A–2D, the substrate materials and dimensions are similar to those used in the embodiment of FIGS. 1A–1D, and FIG. 3. Of course, the masking materials used are also the same as were described previously. In FIG. 2B, regions 24 are etched into the exposed surface portions of the substrate 20. Masking material 26 is then deposited into these etched regions 24 and onto photoresist 22 (FIG. 2C). After this, the photoresist (and its overlying masking material) is dissolved away, leaving the structure of FIG. 2D. As was mentioned previously, the considerations used for choosing the thickness of the masking material 26 are the same as those applied for the mask of FIG. 3. For instance, by choosing the proper thickness of masking material 26 it is possible to provide a semitransparent mask which is opaque to ultraviolet radiation and transparent to visible radiation.

Figure 4:
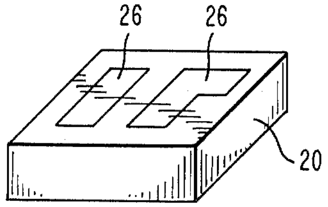
FIG. 4 is an illustration of a mask in which the masking material is located in various regions in the substrate surface.

A possible final configuration for masks produced by the method shown in FIGS. 2A–2D is illustrated in FIG. 4. Here, the substrate 20 has buried masking material 26 which forms a geometric pattern. This mask can be placed onto a surface and used for component fabrication wherever photoresist techniques are employed.

Figure 3:
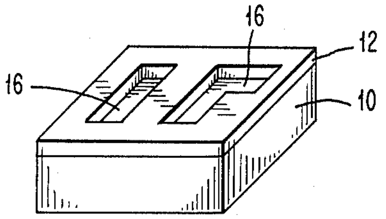
FIG. 3 is an illustration of a mask in which a thin film of masking material has etched holes therein.

The masks of FIGS. 3 and 4 can be fabricated by techniques other than those described previously. For instance, an alternate technique is to use an electron beam to fabricate a master mask. Further masks are made from this master mask by techniques such as those described with reference to FIGS. 1A–1D and FIGS. 2A–2D. This results in a mask with very high resolution.

Another suitable technique for making a mask is projection masking. Here, a large mask is initially manufactured and then is reduced onto photoresists in order to obtain successfully smaller masks. That is, each mask is imaged onto photoresists through a reducing lens in order to provide successively smaller masks. $GdFeO_3$ and the other materials described herein are easily adapted for projection masking and electron beam exposure techniques which are conventionally well known. By the use of these techniques, it is possible to obtain sub-micron structures with good edge definitions. Such masks in turn are used to make fine structures on semiconductors, such as silicon devices. Since these materials are harder than silicon and other commonly used semiconductors, the masks will have very long lifetimes. This is economically important, since the cost of the mask is sufficiently greater than that of the underlying semiconductor wafers.

In defining the geometric pattern of the mask, conventional techniques such as projection masking can be used. Since the resolution obtainable depends upon the wavelengths of the light used to expose the photoresist, electron beam fabrication techniques will produce the smallest mask patterns. Many photoresists can be exposed by electron beam techniques and, if these photoresists are used in making the masks, it will be possible to produce sub-micron geometric patterns.

Projection masking is another technique for producing the mask geometries. In this technique, an image of the desired pattern is projected onto the photoresist covered masking layer by means of a high resolution lens. If a high quality lens is used, an entire one inch wafer can be exposed, giving patterns as small as 2.5 microns. If a high quality microscopic lens is used, patterns as small as 0.5 microns can be produced on an area of approximately 0.5×0.5 millimeters.

Figure 5:
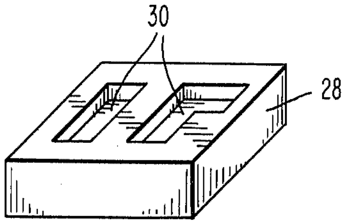
FIG. 5 is an illustration of a mask comprising a bulk crystal having regions of varying thickness therein.

FIG. 5 is an embodiment of a fabrication mask in which a bulk crystal 28 of masking material has patterned grooves 30 therein which provide regions of crystal 28 having lesser thickness. The thick portions of crystal 28 are opaque to the radiation used in photoresist processing whereas the thinner regions of crystal 28 (formed by grooves 30) are transparent to this radiation. For instance, a thin region of less than 500 angstroms is transparent to ultraviolet radiation. Therefore, grooves 30 are etched deeply enough into crystal 28 so that the thin regions below these grooves have a thickness less than 500 anstroms in order to be transparent to ultraviolet radiation.

A fabrication mask in accordance with FIG. 5 has an advantage that it is very formable and can be made to conform to the substrate wafer topology. However, these crystals are somewhat fragile and deep etching into them may cause some spreading of the grooves 30. This will hinder their use in high resolution fabrication processes.

Figure 6:
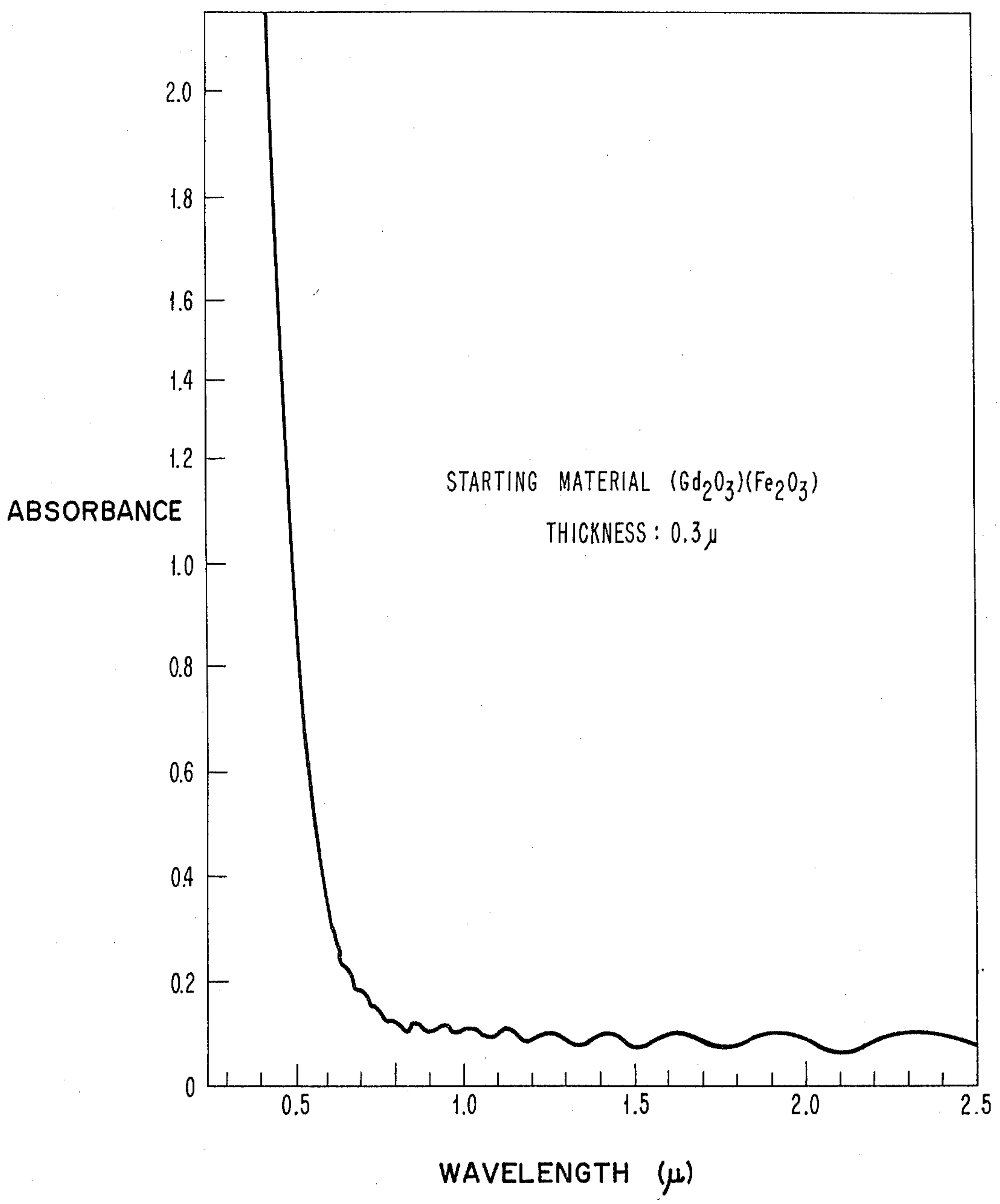
FIG. 6 is a plot of optical absorption versus wavelength for one of the masking materials of the present invention.

FIG. 6 is the plot of optical absorption versus wavelength for a $GdFeO_3$ mask which has been sputtered from a mixture of $Fe_2O_3$ powders. This illustrates the optical characteristics of these masks. From this plot it is readily evident that these films can be made with thicknesses to provide opacity in the ultraviolet range and transparency in the visible range so as to provide semitransparent masks.

What has been described is a mask using materials which have not heretofore been suggested for use in this manner. These masks combine the features of high hardness, a capability for continual visual alignment, and compatability with present day photoresist techniques to produce a mask which is superior to those presently used. The materials used are rare earth orthoferrites, $YFeO_3$, $LaFeO_3$ and various combinations of rare earth orthoferrites. A particularly suitable technology for use of these masks is semiconductor processing.

What is claimed is:

1. A mask suitable for use in the fabrication of components by processes utilizing radiation, comprising:

a supporting medium transparent to said radiation and to visible light, a masking material which is substantially opaque to said radiation located on said supporting medium, said masking material having a geometric pattern useful in said fabrication process and defining areas of said mask which are substantially transparent to said radiation, said masking material being comprised of a material selected from the group consisting of rare earth orthoferrites, $YFeO_3$, $LaFeO_3$, and mixed rare earth orthoferrites.

2. The mask of claim 1, where said masking material has a thickness between about 500 angstroms and 20,000 angstroms.

3. The mask of claim 1, where said masking material is comprised of a layer supported by said supporting medium having holes etched in it which extend substantially to said supporting medium.

4. The mask of claim 1, where said masking material is buried in regions in said supporting medium.

5. The mask of claim 1, where said mixed rare earth orthoferrites are given by the formula $(RE)_1FeO_3$, where RE is a plurality of rare earth elements.

6. The mask of claim 1, where said rare earth orthoferrite is $GdFeO_3$.

7. A mask suitable for use in the fabrication of components by processes utilizing radiation, comprising:

a bulk crystal substantially opaque to said radiation having regions of reduced thickness substantially transparent to said radiation which define a geometric mask pattern, said bulk crystal being comprised of a material selected from the group consisting of rare earth orthoferrites, $YFeO_3$, $LaFeO_3$, and mixed rare earth orthoferrites.

8. The mask of claim 7, where said mixed rare earth orthoferrites are comprised of a plurality of rare earth elements.

9. A mask for use in the production of components by photoresist techniques wherein radiation is used to expose said photoresist, comprising:

a first medium which is transparent to said radiation and to visible wavelengths, a second medium substantially opaque to said radiation and formed in a pattern on said first medium, to define the desired mask pattern, said pattern having regions which are substantially transparent to said radiation, said second medium being a rare earth orthoferrite.

10. A mask for use in the production of components by photoresist techniques wherein ultraviolet radiation is used to expose said photoresist, comprising:

a first medium which is transparent to said radiation and to visible wavelengths, a second medium substantially opaque to said radiation and formed in a pattern on said first medium to define the desired mask pattern, said pattern having regions which are substantially transparent to said radiation, said pattern having regions which are substantially transparent to said ultraviolet radiation, said second medium being comprised of a rare earth orthoferrite.

* * * * *